United States Patent
Titizian et al.

(12)

(10) Patent No.: US 6,331,931 B1
(45) Date of Patent: Dec. 18, 2001

(54) RADIO FREQUENCY POWER DEVICE IMPROVEMENT

(75) Inventors: John H. Titizian, Los Angeles; Jeffrey A. Burger, Rolling Hills Estates; Young H. Kim, Fullerton, all of CA (US)

(73) Assignee: Integra Technologies, Inc., Torrance, CA (US)

( * ) Notice: Subject to any disclaimer, the term of this patent is extended or adjusted under 35 U.S.C. 154(b) by 0 days.

(21) Appl. No.: 09/677,926

(22) Filed: Oct. 3, 2000

Related U.S. Application Data

(62) Division of application No. 09/289,526, filed on Apr. 9, 1999, now Pat. No. 6,181,200.

(51) Int. Cl.[7] .......................... H01G 4/228; H01G 4/232; H01G 4/06
(52) U.S. Cl. .................. 361/306.3; 361/309; 361/308.3; 361/311
(58) Field of Search ................................. 361/301.4, 303, 361/304, 305, 306.1, 306.2, 306.3, 307, 308.1, 308.2, 308.3, 311–313, 320, 321.1–321.5

(56) References Cited

U.S. PATENT DOCUMENTS

| | | | |
|---|---|---|---|
| 4,864,465 | * | 9/1989 | Robbins ............................... 29/25.03 |
| 5,982,018 | * | 11/1999 | Wark et al. ............................ 257/532 |
| 6,043,973 | * | 3/2000 | Nagashima et al. .................. 361/305 |
| 6,078,494 | * | 6/2000 | Hansen ............................... 361/321.5 |
| 6,088,215 | * | 7/2000 | Webb et al. .......................... 361/306.3 |

FOREIGN PATENT DOCUMENTS 6-302465 * 10/1994 (JP) ................................. H01G/4/08

* cited by examiner

Primary Examiner—Dean A. Reichard
Assistant Examiner—Eric W. Thomas
(74) Attorney, Agent, or Firm—Blakely, Sokoloff, Taylor & Zafman LLP

(57) ABSTRACT

An radio frequency (RF)/microwave power amplification circuit is disclosed herein having improved power and frequency characteristics. The RF power circuit is characterized by having the output capacitance of the device resonate with a shunt inductance that is physically closer to the device than provided in conventional RF power circuits. This is realized by mounting a direct current (DC) bypass capacitor directly on the same metalized pad that the device terminal is mounted on. By doing this, the inductance associated with a wire bond connection from the device to the capacitor is eliminated or at least reduced. Also disclosed is a dual cell power circuit that consists of matching the impedance characteristics of the active cells to each other by adjusting the circuit parameters in which the active devices interact with. In addition, an RF power circuit is disclosed that includes a pair of vertical cells in a parallel relationship formed on a thin semiconductor to cause more current flow through a metal layer rather than the lossy substrate. Furthermore, a novel metal-dielectric-metal chip capacitor is disclosed that is fabricated on a refractory metal substrate, which results in a high quality factor (Q) for the capacitor. The capacitor has contacts to both capacitor plates by way of its top metallization surfaces, and access to one of the plates through the bottom, i.e. the mounting surface of the capacitor. Additionally, a high power device is disclosed that encompasses at least some or all of the techniques described above to achieve an amplification that exhibits both high power and high cutoff frequency characteristics.

16 Claims, 16 Drawing Sheets

3chip horizontal layout

A Vertical layout with four cells with 3 Degrees electrical length limit

Q-BIPOLAR TRANSISTOR CHIP
E-EMITTER CONTACT-BOND PAD
B-BASE CONTACT-BOND PAD
C-COLLECTOR CONTACT-BACK OF CHIP
C1-DC BLOCKING CAPACITOR
LS-SHUNT INDUCTOR
LB-BASE INDUCTANCE
LC-COLLECTOR INDUCTANCE

Q-BIPOLAR TRANSISTOR CHIP
E-EMITTER CONTACT-BOND PAD
B-BASE CONTACT-BOND PAD
C-COLLECTOR CONTACT-BACK OF CHIP
C1-DC BLOCKING CAPACITOR
LS-SHUNT INDUCTOR
LB-BASE INDUCTANCE
LC-COLLECTOR INDUCTANCE

Q – BIPOLAR TRANSISTOR CHIP
E – EMITTER CONTACT-BOND PAD
B – BASE CONTACT-BOND PAD
C – COLLECTOR CONTACT-BACK OF CHIP
C1 – DC BLOCKING CAPACITOR
LS – SHUNT INDUCTOR
LB – BASE INDUCTANCE
LC – COLLECTOR INDUCTANCE

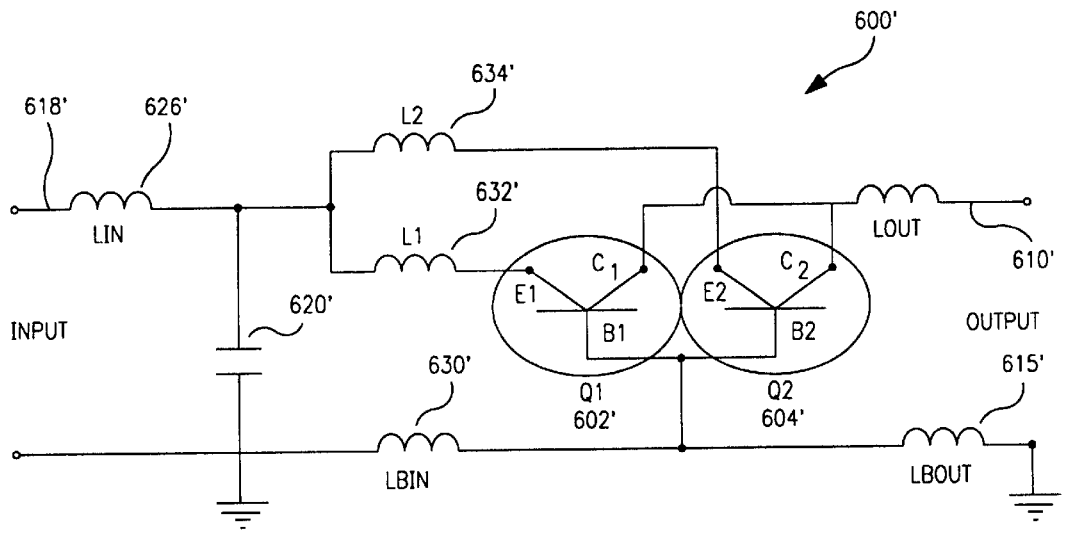

C₁-COLLECTOR OF Q1
C₂-COLLECTOR OF Q2
Q1-BIPOLAR TRANSISTOR CELL
Q2-BIPOLAR TRANSISTOR CELL
E1-Q1 EMITTER CONTACT-BOND PAD
E2-Q2 EMITTER CONTACT-BOND PAD
B1-Q1 BASE CONTACT-BOND PAD
B2-Q2 BASE CONTACT-BOND PAD
L1-SERIES EMITTER INDUCTOR FOR Q1
L2-SERIES EMITTER INDUCTOR FOR Q2
LBIN-SERIES INPUT BASE INDUCTOR FOR Q1 & Q2
LBOUT-SERIES OUTPUT BASE INDUCTOR FOR Q1 & Q2
LIN-SERIES INPUT INDUCTOR
LOUT-SERIES COLLECTOR INDUCTOR
C-SHUNT INPUT CAPACITOR

FIG. 6B

RADIO FREQUENCY POWER DEVICE IMPROVEMENT

CROSS-REFERENCES TO RELATED APPLICATIONS

This is a divisional of a U.S. patent application Ser. No. 09/289,526, filed Apr. 9, 1999, now U.S. Pat. No. 6,181,200 which is incorporated herein by reference.

FIELD OF THE INVENTION

The present invention relates generally to radio frequency (RF)/microwave power devices and circuits, and in particular, to packaging and fabricating methods for providing improved bandwidth performance and power handling capability of RF/microwave power devices and circuits.

BACKGROUND OF THE INVENTION

Prior to the use of solid state devices in RF/microwave power circuits, the primary method of providing high-frequency amplification was through the use of vacuum tubes. In the early days of RF power technology, vacuum tubes could be designed to provide the desired power amplification given the particular frequency ranges in use. In other words, tubes could be scaled up for power amplification purposes and their corresponding frequency response would still meet the desired purpose. However, there are several undesirable characteristics of vacuum tubes. For instance, tubes are typically large in size. Tubes also generate substantial amount of heat due to high filament currents. Also, tubes are less reliable due to physical stress caused by the high heat being generated. Thus, in the early days, there was a need for a different approach to RF power technology.

The development of semiconductor devices offered a new and improved approach to RF power technology. Although the use of early semiconductor devices resulted in some improvement in the performance of RF power circuits, these devices typically did not provide adequate power amplification for some RF applications. Consequently, techniques were developed to improve the power delivery capability of these early semiconductor devices. For instance, one technique was to add more material to these devices so that they could dissipate more power. However, this adversely affected the frequency response of these devices. This tradeoff between the power delivery capability of a device and its frequency response is known as the power dissipation vs. maximum frequency (cutoff frequency) tradeoff, and is used to characterize the performance of power devices today.

Recent developments in solid state devices have resulted in RF power devices that have improved power dissipation vs. maximum frequency performance. As a result, these newly developed power devices are being used in areas where vacuum tubes typically dominated. These newly developed devices are generally manufactured using silicon-based dies. However, other materials have or can be used, including Indium Phosphate, Gallium-Arsenide, Silicon-Germanium, and potentially Silicon Carbide. Although the recent improvements in solid state devices have been substantial, device manufacturers still strive to produce higher frequency solid state devices that have higher power delivery capability with improved efficiency.

There are several techniques used today by manufacturers to improve the power dissipation vs. maximum frequency performance of power devices and circuits. These techniques include (1) increasing the horizontal cell length of the semiconductor device; (2) increasing the vertical cell length of the semiconductor device; (3) providing parallel power circuits; (4) providing sub micron structures; and (5) forming silicon devices on diamond or silicon carbide materials for improving power dissipation. Although these techniques improve the power dissipation vs. maximum frequency performance of power devices and circuits, they also have undesirable characteristics.

FIG. 1 illustrates one approach that is currently used to increase the power handling capability of RF silicon devices, i.e. increasing the horizontal length 102 of a device cell. The horizontal length 102 of a device cell is substantially orthogonal to the flow of carriers in the device. It follows that the greater the horizontal length of a cell is, the greater amount of current flow can be achieved, without increasing the current density. Thus, increasing the horizontal length of a cell improves its current flow handling capability, which results in an improved power handling performance for the cell.

One problem with this approach occurs when the horizontal length of the cell is increased to near a quarter wavelength at the operating frequency of the device. When this occurs, the power handling capability of the device no longer increases proportionally with the increase of the cell length. The reason for this is that when the horizontal length of the cell is at or near a quarter wavelength, the cell behaves like a transmission line. The transmission line behavior results in a power distribution across the cell that is not uniform. As a result, the efficiency of the cell decreases, the dissipated power increases, and the operating junction temperature of the device increases. Furthermore, these factors result in a relatively large temperature gradient across the device that adversely affects the reliability of the device.

An additional problem with increasing the horizontal length of the cell is that it becomes more difficult to achieve a desirable impedance matching for the device. Specifically, as the device increases in size, the associated transmission line in the output circuit that collects the amplified waves, sets up a voltage standing wave ratio (VSWR) that can cause parasitic oscillations and/or catastrophic burn out. For example, if the impedance matching is such that a 1.5:1 VSWR results in wide band applications, it is very likely that spurious oscillations will be generated. Spurious outputs are undesirable in many applications. For instance, spurious oscillations can be especially harmful in radar applications due to the high power of radar pulses. These radar-associated spurious oscillations, commonly referred to as "pulse break up", can disturb the broadcast envelope of high frequency pulses and render radar components, such as amplifiers, useless for its desired applications. For such reason and others, the Federal Communications Commission (FCC) places strict limitations on the broadcast envelope of radar pulses.

As seen in FIG. 1, the problem of the horizontal cell length approaching a quarter wavelength is not only present when there is a single cell, but also when a plurality of cells are combined in a parallel relationship. FIG. 1 illustrates a parallel arrangement of three silicon cells 104, 106 and 108. The cells 104, 106 and 108 are horizontally arranged. Similar quarter wavelength problems occur when the combined horizontal length of the cells 104, 106 and 108 approach a quarter wavelength at the operating frequency of the devices. As previously stated, this can result in the formation of undesirable spurious oscillations.

FIG. 2 illustrates another approach that is currently used to increase the power handling capability of RF silicon devices, i.e. increasing the vertical length 202 of a device cell. Increasing the vertical length of a cell, just as with increasing the cell horizontal width, can produce RF power devices with increased capability. However, increasing the vertical length beyond a certain electrical length also has diminishing returns. One reason for this is that when the vertical length of the cell is increased, the amplified wave emerging from the bottom end of the cell is typically out of phase with the amplified wave emerging from the top of the cell. This phase differential decreases the summed power of the out of synchronous wave resulting in a lowering of the efficiency of the device. Typically, this occurs when the vertical length of the cell approaches three (3) degrees with respect to the wavelength of the operating frequency. When cells are horizontally arranged and their vertical lengths have been increased, there may exist two potential problems, i.e. the problem associated with the horizontal electrical length of the cell approaching a quarter wavelength, and the problem associated with the vertical electrical length approaching three (3) degrees. As seen in FIG. 1, a parallel arrangement of three vertical cells 204, 206, 208, and 210. The cells 204, 206, 208, and 210 are horizontally arranged. Similar quarter wavelength problems occur when the combined horizontal length of the cells 204, 206, 208, and 210 approach a quarter wavelength at the operating frequency of the devices. As previously stated, this can result in the formation of undesirable spurious oscillations.

Because of the aforementioned design restrictions on the horizontal and vertical lengths of a cell, some manufacturers offer "fragile" devices. A device is "fragile" if its vertical and horizontal lengths are near the upper operating limits, as previously discussed. They are characterized by having marginal stability, i.e. they can survive a maximum load mismatch of 1.15:1 VSWR. Examples of fragile RF devices can be found among commercial devices that operate in the S band frequency region, i.e. between two (2) to four (4) GHz. Commonly, commercial S band devices have efficiencies in low 40 percent range, and maximum power levels below 150 Watts.

Yet another approach that is currently used to increase the power handling capability of RF power circuits is to use parallel techniques. The basic principle behind parallel techniques is to divide input signal among several devices, and then re-combine the amplified signals produced by them. One common parallel method is the "Wilkinson" method. The Wilkinson method employs distributed microstrip technologies to divide the input signal into a plurality of input signals. The resulting input signals are then applied to respective devices for amplification. The amplified signals are then re-combined to form a higher power output signal.

There are several problems with parallel techniques. One is that they typically require a substantial amount of real estate to implement. Another problem is that there is little difference between employing parallel techniques and simply using discrete transistors. If such is the case., manufacturers may just as well form their power circuits by combining discrete transistors, instead of using integrated devices. Thus, employing parallel techniques may not be a feasible solution.

An additional approach that is currently used to increase the power handling capability of RF power devices is to use sub micron structures. Sub micron structures can increase the effective device area, thereby causing an increase in the current injected within the device. As a result, devices having sub micron structures typically have improved power handling capability. However, sub micron structure are generally difficult to manufacture, and require an expensive, state-of-the-art wafer fabrication facility. Thus, because of the difficulty and expense of manufacturing RF devices with sub micron structures, they are not widely used for most applications.

FIG. 3 illustrates a further approach that is currently used to increase the power handling capability of RF power circuits and devices, i.e. the use of silicon on diamond techniques. Silicon on diamond technique comprises mounting a silicon device 302 on a diamond carrier 304. Because diamond is a highly efficient conductor of heat, a diamond substrate 304 acts as a heat sink and heat spreader, and allows more power to be extracted from a semiconductor device during operation of the device. This results in the semiconductor device operating under cooler temperature conditions, which improves the power handling capability of the device.

Research in this area has not yet produced economically viable products. Diamond packages, such as shown in FIG. 3, are several times more expensive than Beryllium-oxide (BeO) packages, another known heat conductor. BeO is also characterized by having low electrical conductivity, which makes it advantageous in certain applications requiring electrical insulation and heat dissipation. In addition, BeO can be significantly less expensive than diamond.

The industry has also researched other materials for use in the fabrication of high frequency power semiconductor devices. Silicon Carbide, for example, has been promising, but commercialization has been difficult. Silicon Carbide wafers, the basic building block for Silicon Carbide devices, have a tendency to contain excessive crystalline defects. As a result of excessive crystalline defects, Silicon Carbide wafers typically exhibit lower yields. Because of these manufacturing difficulties, Silicon Carbide wafers are substantially more expensive than silicon wafers.

SUMMARY OF THE INVENTION

Accordingly, to overcome limitations in the prior art described above, and to overcome other limitations that will become apparent upon reading and understanding the present specification, preferred embodiments of the present invention address the above-noted industry needs by employing fabrication techniques, which increase the power handling capability and frequency response of solid state amplification devices and circuits.

Embodiments containing the present invention relate generally to radio frequency (RF) power semiconductor devices, circuits and applications. Radio frequency (RF) power devices are employed in radio transmitters, radar applications, wireless communication systems, RF heating devices and many other applications.

A first preferred embodiment of the improved device comprises a portion of the overall improvement. It comprises resonating of the output capacitance of the transistor with a shunt inductance at the chip level closer than industry standards. More specifically, it comprises rearranging the mounting of the DC blocking capacitor from its industry standard placement on a its own metallization, to the same metallization pad which the transistor or active device is mounted on. The common metallization pad provides the electrical connection for coupling the transistor to the DC blocking capacitor.

In accordance with industry practice, it is common for a DC blocking capacitor to be mounted on its own metalized pad and then connected via bonding wires to a transistor device. In the first preferred embodiment of the invention, a DC blocking capacitor is placed on the same metalized pad on which an RF transistor is placed. Electrical contact between the collector of the transistor and one of the plates of the DC blocking capacitor is made through the metalized pad. Although different types of blocking capacitors may be used, the metal-dielectric-metal capacitor, which is described further herein, is particularly suited for this application.

The rearranged mounting of the DC blocking capacitor provides an improvement in both power handling capability and frequency response by eliminating a series inductance that would otherwise be disposed between the DC blocking capacitor and the device. The elimination of this intervening inductance can significantly increase the frequency response of the corresponding circuit (e.g. an amplifier).

A second embodiment of the invention improves the power handling distribution among a plurality of devices employed as part of a common circuit. More specifically, the improvement comprises matching the impedance characteristics of the active cells to each other. The matching of the characteristics of the devices is accomplished by adjusting the circuit parameters in which the active devices (cells) interplay with. For example, adjusting the circuit parameters may include manipulating the wire interconnect bonds to add or subtract inductance from the overall equivalent circuit of the device.

A third embodiment of the invention improves the frequency response and increases the output power of RF power circuits, particularly when these circuits include devices configured in a parallel arrangement. More specifically, the improvement lies in thinning the silicon substrate of the device to force more of the device current through a thick film metallization layer of the device package, than through the lossy silicon substrate of the device.

A fourth embodiment of the invention provides a novel metal-dielectric-metal chip capacitor. This capacitor provides improved performance because it is fabricated on a refractory metal substrate, which results in a high quality factor (Q) for the capacitor. The capacitor also has contacts to both capacitor plates by way of its top metallization surfaces, and access to one of the plates through the bottom, i.e. the mounting surface of the capacitor. The metal layer which provides access to the capacitor mounting surface can also serve as a convenient access to a ground plane, or alternatively, can serve to make an electrical connection with the terminal of a device. The fourth embodiment also presents an alternative chip capacitor that employs a thinned layer of semiconductor for the capacitor substrate.

A fifth embodiment of the invention illustrates a high power, high frequency device which encompasses at least some or all the techniques disclosed of the previous four embodiments, to achieve an amplification that exhibits both high power and high cutoff frequency characteristics.

These and various other advantages and features of novelty which characterize the invention are pointed out with particularity in the claims annexed hereto and form a part hereof. However, for a better understanding of the invention, its advantages, reference should be made to the drawings which form a further part hereof, and to accompanying descriptive matter, in which there are illustrated and described specific embodiments of an apparatus in accordance with the invention.

Throughout the disclosure, reference is made to a device, a semiconductor device, a bipolar transistor, a bipolar silicon transistor, or the like. This disclosure pertains to RF power devices which are used within an amplification and/or other circuits. Although silicon is a popular material for fabricating such devices, other materials are also used. The apparatus disclosed in the embodiments of the invention may be made of a variety of semiconductor materials and the various aspects of the invention can prove of value regardless of the semiconductor material used.

Throughout the disclosure, reference is made to means of interconnecting devices and circuit elements. A common way of connecting portions of devices is through the use of wire bonds. Those skilled in the art will recognize that, although wire bonds are effective in forming interconnections and are illustrative in explaining the various attributes of this disclosure, there are many alternative methods of effecting interconnections. The various aspects of the disclosure can prove of value, regardless if the interconnection means is that of wire bond, coax connectors, tape automated bonding, microstrip, stripline, and/or any other electronic coupling means for connecting high frequency circuits.

BRIEF DESCRIPTION OF THE DRAWINGS

FIG. 6B illustrates an equivalent circuit of the dual-device power circuit shown in FIG. 6A;

Figure 1:
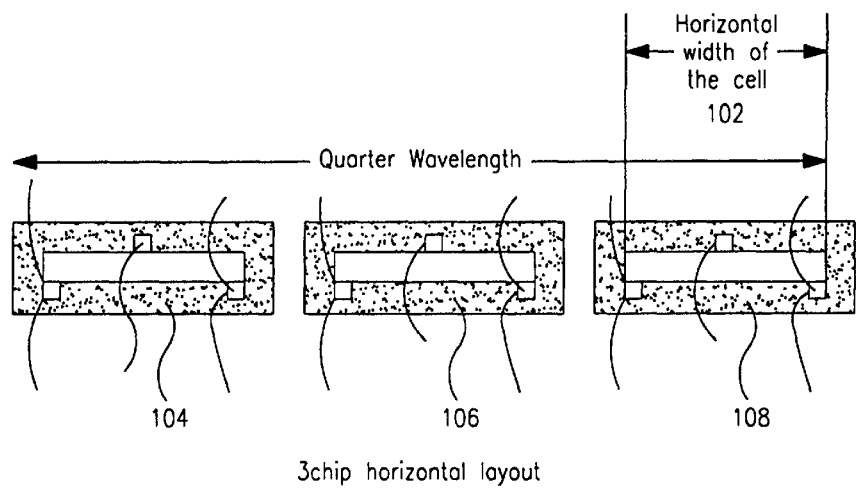
FIG. 1 illustrates three silicon cells arranged in a horizontal, parallel configuration.

DETAILED DESCRIPTION OF THE PREFERRED EMBODIMENT IMPROVED RF POWER DEVICE CIRCUIT

FIG. 4 illustrates a top view of a conventional RF power circuit 400. The RF power device 400 consists of a bipolar transistor RF device 402 mounted on a ceramic carrier 404. The RF power device 402 is disposed on a metalized pad 406, which is a common practice in the art. The RF power device 402 includes a mounting surface 408 that is electrically coupled to the collector of the RF transistor 402, and is also electrically coupled to the metalized pad 406. A DC blocking capacitor 410 is mounted on an adjacent metalized pad 412, which is electrically isolated from the metalized pad 406 on which the RF transistor 402 is mounted. The metalized pad 412 is electrically coupled to a metal grounding layer (not shown) underlying the ceramic carrier 404 by way of a plurality of plated-through holes 413. The DC blocking capacitor 410 includes a metallic case 414 that mounts on the metalized pad 406.

One of the plates 411 of the DC blocking capacitor 410 is electrically coupled to the collector of the RF transistor 402 through a series of connection points 416. A plurality of wire bonds (LS) 418 electrically couples the connection points 416 with metalized pad 406. The other plate 414 of the DC blocking capacitor (C1) 410 is electrically coupled to a ground plane and to the base of the RF transistor 402, also through a series of connection points 420. A plurality of wire bonds (LB) 422 electrically couples the connection points 420 to the base of the RF transistor 402, to effectuate a grounding thereof. The collector of the RF transistor 402 is electrically coupled to an output lead 424 of the power circuit 400 by way of a plurality of wire bonds (LC) 426. All the wire bonds are designated with an L, i.e. LS, LB, and LC because they inherently possess inductance.

Figure 4A:
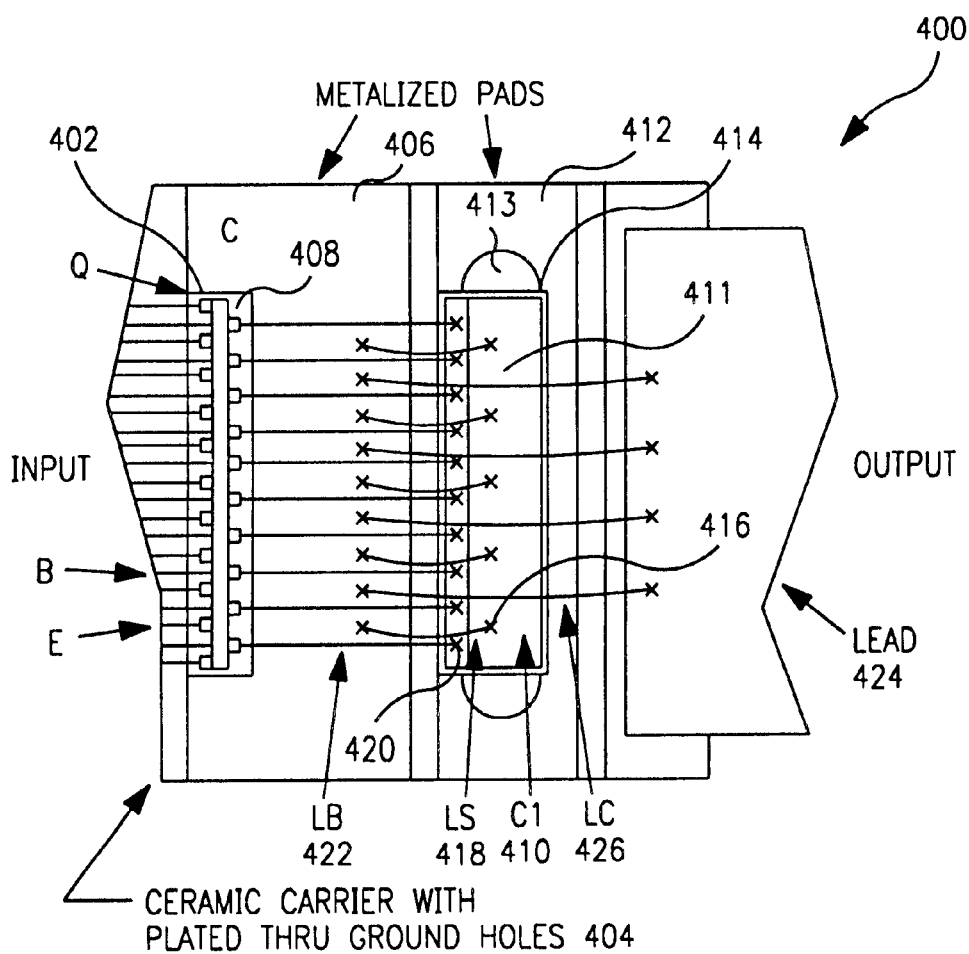
FIG. 4A illustrates a layout drawing of a conventional RF Power Circuit.
Figure 4B:
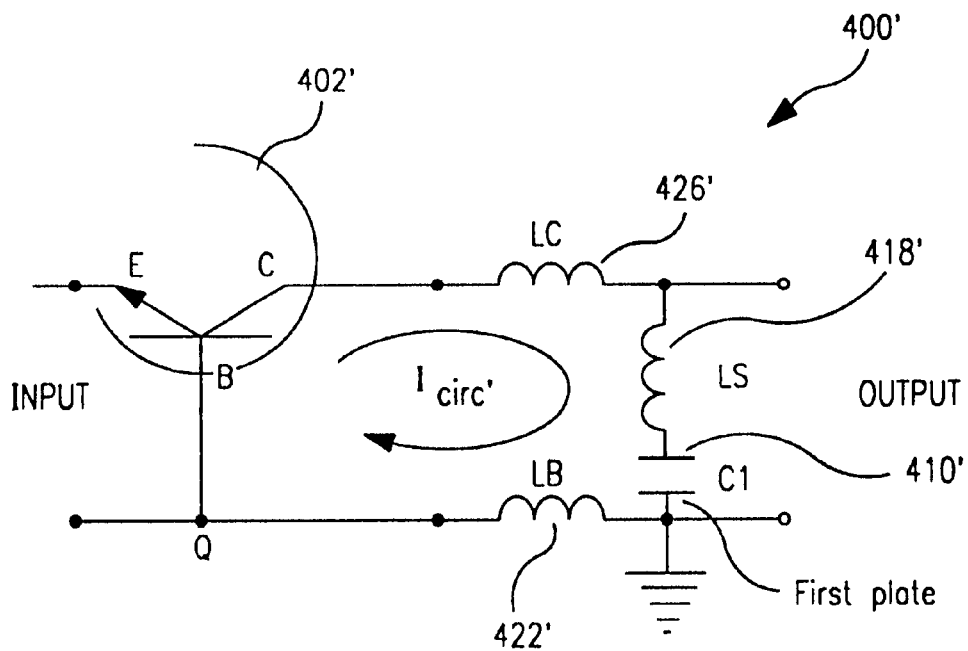
FIG. 4B illustrates a schematic diagram of an equivalent circuit of the conventional RF device shown in FIG. 4A.

FIG. 4B illustrates a lumped-element equivalent circuit 400' for the conventional RF power circuit 400 shown in FIG. 4A. The equivalent circuit 400' consists of a bipolar transistor 402' arranged in a common-base configuration. The emitter of the bipolar transistor 402' serves as an input to the circuit 400' for receiving an input RF signal. The collector of the bipolar transistor 402' is connected in series with wire bond inductor (LC) 426', wire bond inductor (LS) 418', and capacitor (C1) 410' to a ground terminal. A wire bond inductor (LB) 422' is connected in between the ground terminal and the base of the transistor 402'. An output voltage of the circuit 400' is developed across series-connected inductor (LS) 418' and capacitor (C1) 410'.

From a circuit design perspective, the conventional RF power circuit is designed so that wire bond inductance 418' (LS) resonates with an intrinsic capacitance of the collector of the transistor 402' at the desired operating frequency of the circuit 400' However, the resonant circuit for the equivalent lumped-element conventional power circuit 400' not only includes inductance 418' (LS), but also includes parasitic inductances 426' (LC) and 422' (LB), as well as DC blocking capacitor 410' (C1). Each of these additional elements contribute to the overall IR loss for the circuit 400', which adversely affects the output power and frequency performance for the circuit 400'. The DC blocking capacitor 410' (C1) is required because there is a need to isolate the base of the transistor 402' from the DC bias voltage applied to the collector of the transistor 402'. Accordingly, there is a need for a new RF power circuit design that eliminates the parasitic inductances 426' (LC) and 422' (LB) from the resonant circuit of the RF power circuit 400', to improve the power and frequency characteristics for the circuit 400'.

Figure 5A:
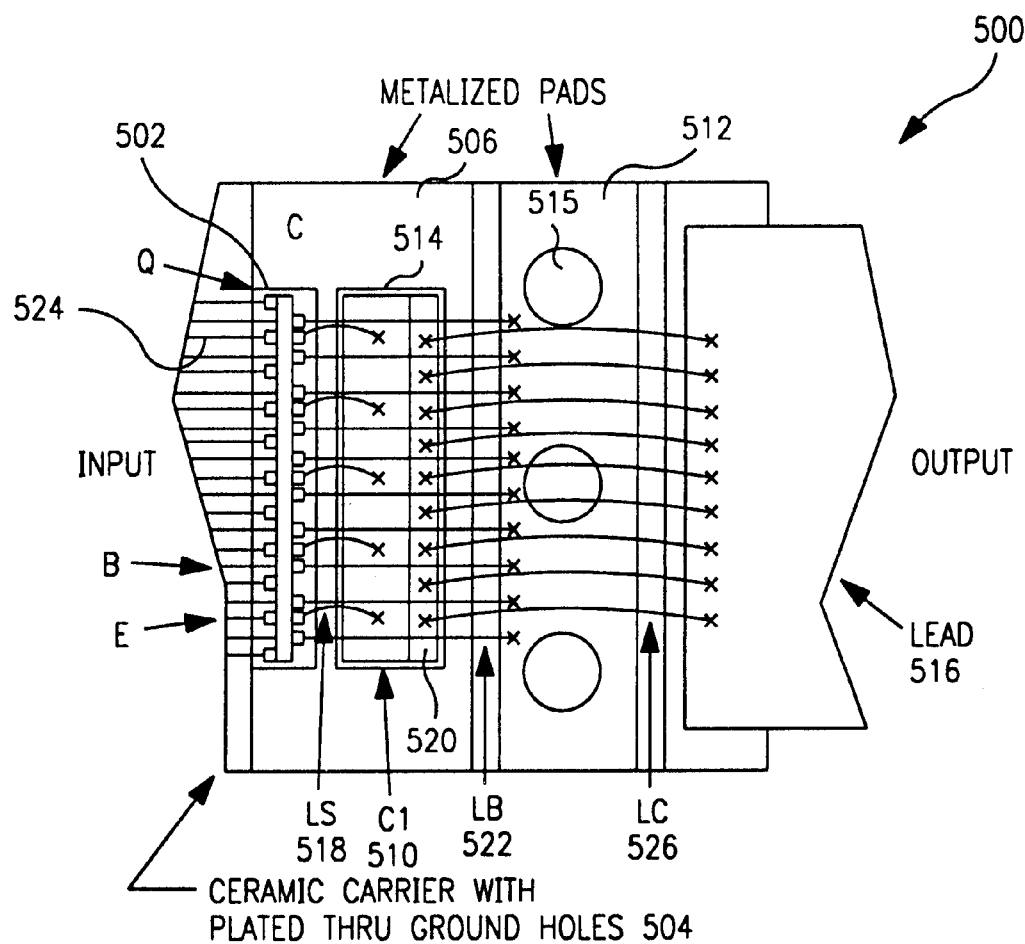
FIG. 5A illustrates a layout drawing of an exemplary RF Power Circuit in accordance with a first aspect of the invention.

FIG. 5A illustrates a top view of an exemplary RF power circuit 500 in accordance with a first preferred embodiment of the invention. The RF power circuit 500 of the invention includes an RF power device 502, such as a bipolar transistor, mounted on a ceramic carrier 504 along with a DC blocking capacitor (C1) 510. The RF power device 502 and DC blocking capacitor are disposed on a metalized pad 506 formed on the top surface of the ceramic carrier 504. The RF power circuit 500 also includes an additional metalized pad 512 formed on top of the ceramic carrier 504, and is electrically isolated from metalized pad 506. Metalized pad 512 is electrically coupled to a metal layer (not shown) underlying the ceramic carrier 504 by way of one or more plated-through holes 515. The underlying metal layer is typically connected to a ground potential.

The top capacitor plate of the DC blocking capacitor 514 is electrically coupled to the base of the transistor 502 by way of one or more wire bonds 518, having an associated inductance (LS). For the purpose of grounding the base of the transistor 502, the base of the transistor 502 is connected to the metalized pad 512 by way of one or more wire bonds 522 having an associated inductance (LB). The lower plate of the DC blocking capacitor 510 is connected to an output lead 516 by way of one or more wire bonds 526 having an associated inductance (LC). The DC blocking capacitor 510 includes a metalized pad 520 for wire bond access to the bottom plate of the capacitor 510. The input of the RF power circuit 500 includes a plurality of wire bonds 524 connected to the emitter of the transistor 502.

The improvement in RF power circuit 500 lies in that the DC blocking capacitor (C1) 510 is moved from a separate metalized pad as employed in the conventional RF power circuit 400 shown in FIG. 4A, to the same metalized pad 506 to which the RF transistor 502 is mounted. The DC blocking capacitor (C1) 510 is preferably of the type that includes a mounting 514 that makes an electrical connection to a bottom plate of the capacitor (C1) 510. Accordingly, by mounting the capacitor (C1) 510 to the metalized pad 506, an electrical coupling between the capacitor (C1) 510 and the collector of the transistor 502 is effectuated. This configuration eliminates the need for the wire bond connection between the collector of the transistor 502 and the DC blocking capacitor (C1) 510, as required by the conventional prior art circuit 400. This new arrangement provides substantial improvement in the frequency response and power handling capability of the new RF power circuit 500.

Figure 5B:
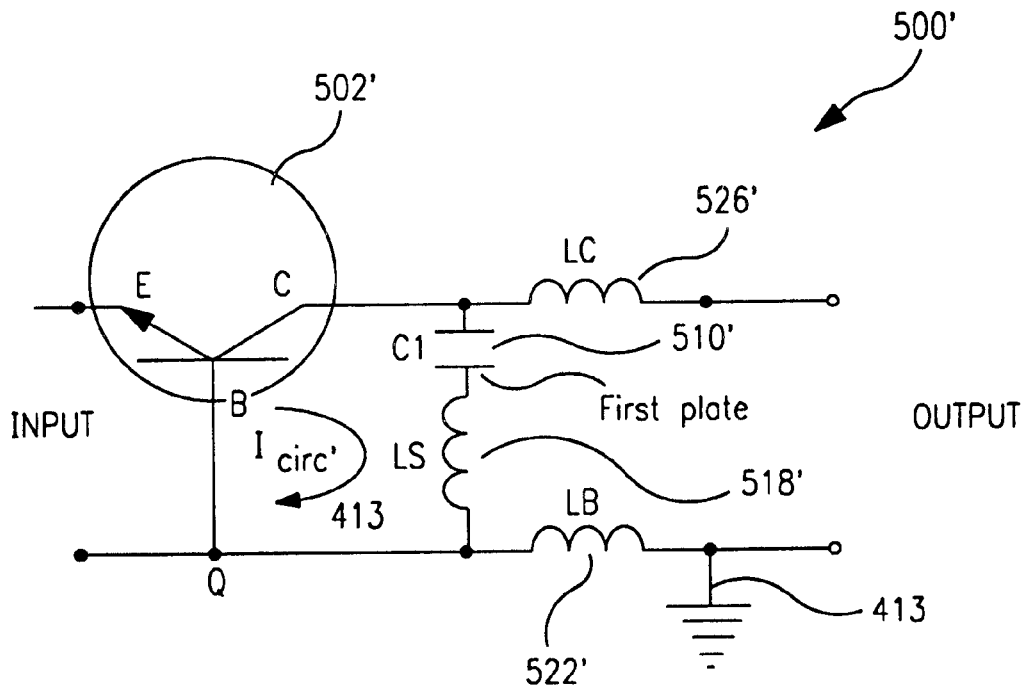
FIG. 5B illustrates an equivalent circuit of the power circuit shown in FIG. 5A.

FIG. 5B illustrates a lumped-element equivalent circuit 500' for the new RF power circuit 500. The equivalent circuit 500' comprises essentially the same elements as that of the convention equivalent circuit 400'. However, the positioning and values of the circuit elements are substantially altered. Specifically, the repositioning of the DC blocking capacitor (C1) 510 to the same metalized pad 506 that the transistor 502 is mounted on, repositions both inductors (LC) 526' and (LB) 522' to the output of the equivalent circuit 500' and outside of the circulating current $I_{CIRC}$ loop. In other words, these parasitic inductances (LC) 526' and (LB) 522' are not present in the resonant circuit, which in this case comprises the intrinsic capacitance of the collector of the transistor 502', the DC blocking capacitor 510', and wire bond inductance (LS) 518'. In addition, the values of intervening parasitic inductances (LC) 526' and (LB) 522' are substantially decreased due to shorter wire bond lengths. Both these changes further reduce the effects that the parasitic inductances (LC) 526' and (LB) 522' have on the power and frequency performance of the circuit 500'.

The changes result in an increase in the operating bandwidth of the device 502 and reduces the losses that occur in the impedance matching section. These effects can improve device output power, gain and efficiency. Direct attachment of the shunt inductor (LS) wire bonds to the transistor chip improves the inductance distribution of the impedance matching section. The impedance matching is improved because the input shunt inductance (LS) can be distributed throughout the device without having to traverse inductances (LB) or (LC), as required by the conventional power circuit (see FIG. 4). Not having to go through intermediate inductance (LB) or (LC) improves the distribution of the shunt inductance (LS) across the chip, which in turn improves the power dissipation and frequency response of the circuit.

Improved Dual Device Power Circuit

Figure 6A:
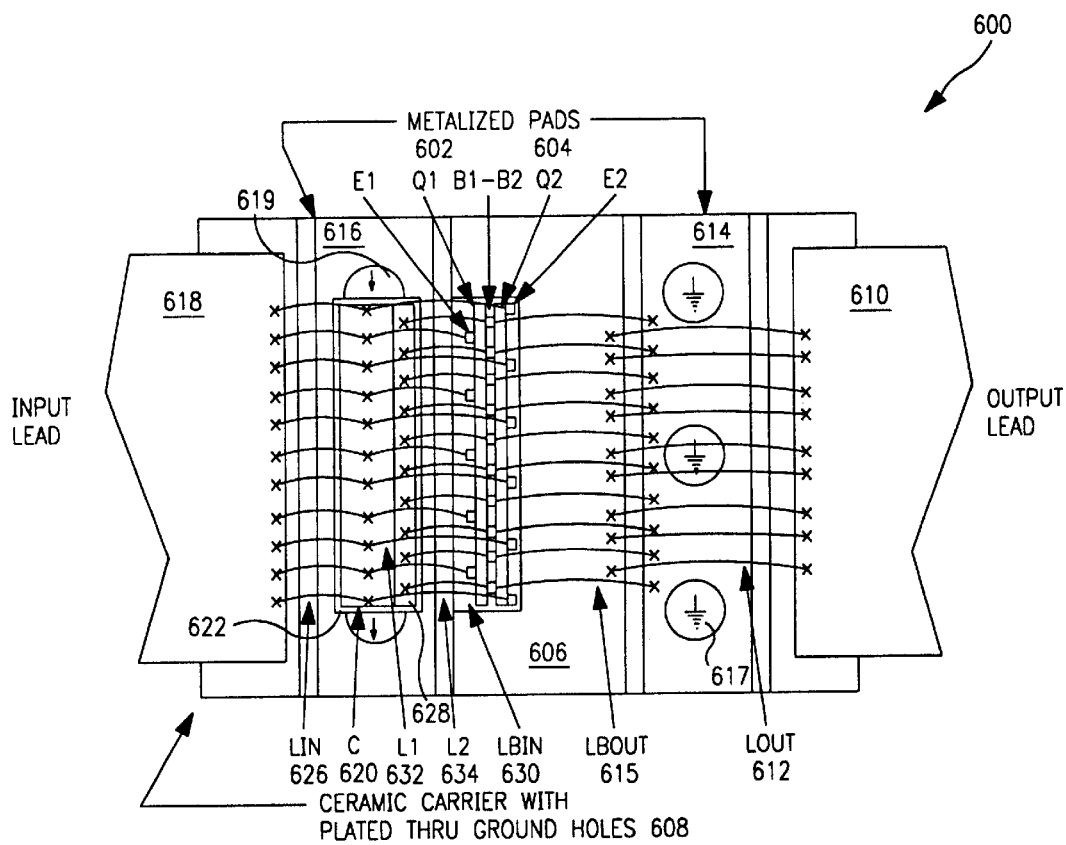
FIG. 6A illustrates a layout drawing of an exemplary dual-device power circuit in accordance with another aspect of the invention.

FIG. 6A illustrates a top view of a second embodiment of an RF power circuit 600 that is characterized as having improved power output capability. The RF circuit 600 comprises two RF power devices 602 (Q1) and 604 (Q2) (e.g. bipolar transistors) configured in a back-to-back relationship, i.e. having a common base top connection and a common collector bottom (mounting) connection. The transistors 602 (Q1) and 604 (Q2) are mounted to a metalized pad 606 disposed on a top surface of a ceramic carrier 608. In this configuration, the metalized pad 606 is electrically coupled to the collectors of the transistors 602 (Q1) and 604 (Q2). The metalized pad 606 is also electrically coupled to an output lead 610 by way of one or more wire bonds 612 having an associated inductance (LOUT). The RF power circuit 600 also includes a second metalized pad 614 disposed on the top surface of the ceramic carrier 608, in between the output lead 610 and metalized pad 606. The metalized pad 614 serves as a ground plane for the RF power circuit 600, and includes one or more plated-through holes 617 electrically connected to a grounded metal layer (not shown) underlying the ceramic carrier 608. The metalized pad 614 is electrically connected to the common base of the transistors 602 (Q1) and 604 (Q2) by way of one or more wire bonds 615 having an associated inductance (LBOUT).

The dual-device RF power circuit 600 also includes a third metalized pad 616 disposed on the top surface of the ceramic carrier 608 in between an input lead 618 and metalized pad 606. The metalized pad 616 also serves as a ground plane for the RF power circuit 600 and includes one or more plated-through holes 619 electrically connected to a grounded metal layer (not shown) underlying the ceramic carrier 608. An input shunt capacitor 620(C) having a bottom mounting capacitor plate 622 mounted on metalized pad 616. The input lead 618 is electrically coupled to the top capacitor plate 624 of input shunt capacitor 620 by way of one or more wire bonds 626 having an associated inductance (LIN). The input shunt capacitor 620 has a metalized pad 628 that provides wire bond access to the bottom capacitor plate 622. The metalized pad 628 is electrically connected to the common base of the transistors 602 (Q1) and 604 (Q2) by way of one or more wire bonds 630 having an associated inductance (LBIN). In this configuration, the common base of the transistors 602 (Q1) and 604 (Q2) has ground connections through both metalized pads 614 and 616.

The top capacitor plate 624 of the input shunt capacitor 620 is electrically connected to the respective emitters (E1) and (E2) of the transistors 602 (Q1) and 604 (Q2) by way of first and second sets of wire bonds 632 and 634, respectively.

The first and second sets of wire bonds 632 and 634 have associated inductances (L1) and (L2), respectively. It should be noted that because of the back-to-back configuration of the transistors 602 (Q1) and 604 (Q2), the emitter (E1) of the transistor 602 (Q1) is at a greater distance from the input shunt capacitor 620 than the emitter (E2) of the transistor 604 (Q2). Consequently, if the wire bonds 632 (L1) and 632 (L2) are configured the same but with different lengths, the input impedance of transistor 602 (Q1) can be significantly less than that of transistor 604 (Q2). As a result, the transistor having the lower impedance ends up with a significantly greater portion of the current.

The difference in input impedances of transistors 602 (Q1) and 604 (Q2) will lead to a current imbalance in the transistors. Because of the current imbalances in the transistors, instead of doubling the power handling capacity of the overall device, the dual device may exhibit significantly less than twice the power handling capacity of a single device. This mismatch in power handling has a tendency to increase the junction temperature of the device handling the greater portion of the power. So, in addition to the initial current mismatch in the devices, the mismatch may have a tendency to increase with the temperature of the devices, thereby lowering the power handling capacity even further.

The second preferred embodiment of the invention provides an effective use of a dual-cell bipolar transistor chip at high frequencies by matching the impedance of the cells. Impedance mismatches can be caused by a number of electrical imbalances. One imbalance is due to differing device characteristics of transistors 602 (Q1) and 604 (Q2). Specifically, these differing device characteristics may be due to unequal physical and electrical distances between the collectors of the active cells and the output lead. Another source of electrical imbalance is the distance between the transistors 602 (Q1) and 604 (Q2) and the wire bond attached to the output lead. These electrical imbalances can cause one of the devices to dissipate a disproportionate amount of power. Since the devices 602 (Q1) and 604 (Q2) are similar, optimum performance can be achieved by causing the devices to dissipate similar amounts of power. In other words, maximum utilization of both devices occurs when power dissipation of both devices is essentially equal.

The second preferred embodiment maximizes circuit performance by a process called impedance matching. Impedance matching is the process of adjusting circuit parameters so that he energy transferred from the power source to the load is distributed uniformly throughout the circuit elements. Since both cells of the device are driving the same load, both cells should operate such that they dissipate essentially equal amounts of power. In this way, one device is not substantially under utilized, and both devices approach the ideal power dissipation, i.e. the two devices provide approximately double the power to the load than can be provided by one device. This technique applies to power circuits having multiple device power devices, where the distances between the devices' respective connections and the input and/or output leads differ.

FIG. 6B illustrates an equivalent circuit 600' for the dual-device RF power circuit 600. The circuit 600' includes an input impedance matching section comprising series inductors 626' (LIN), 632' (L1), and 634' (L2), low-pass shunt capacitor (C) 620', and the emitters of transistors 602' (Q1) and 604' (Q2). The common bases of the transistors 602' (Q1) and 604' (Q2) are electrically coupled to ground by way of wire bond inductances 630' (LBIN) and 615' (LBOUT). The common collectors of the transistors 602'

(Q1) and 604' (Q2) are electrically coupled to the output by way of wire bond inductance 612' (LOUT). Inductors 632' (L1) and 634' (L2) are physically realized as wire bonds attached to one of the capacitor plate (C) and the respective emitters (E1–E2) of the transistors 602' (Q1) and 604' (Q2). In the present embodiment, the manipulation of these wire bonds are used to adjust their corresponding inductances. The adjustment of the inductances are used to alter the input impedances of the devices in order to provide impedance matching.

Although wire bonds are the preferred manner of producing the inductances required, it shall be understood that any electronic coupling means may contain the requisite inductance that may be manipulated for the purpose of impedance matching. As separate circuit elements, the inductance values of the bond wires may be independently manipulated, and matched to the individual circuits. Independent manipulation of the inductance values of the bond wires allows for correction of any electrical imbalances that may be present in the devices and/or the circuit. It shall be understood that the impedance matching can be accomplished through a variety of techniques. The matching can be accomplished through actual measurement, or by calculation of circuit parameters, both techniques are well known in the art. The actual impedance may be adjusted through the choice of different size bond wires, different layouts of the wires, and/or a variety of other means.

Although the present embodiment achieves the impedance matching through the adjustment of wire bonds; other techniques embodied herein can be applied to any interconnection realization method. Other embodiments may employ the manipulation of inductance of other electronic coupling means to achieve an equivalent impedance matching effect. Example electronic coupling means, which may be manipulated for impedance matching, are set forth below.

Figure 7:
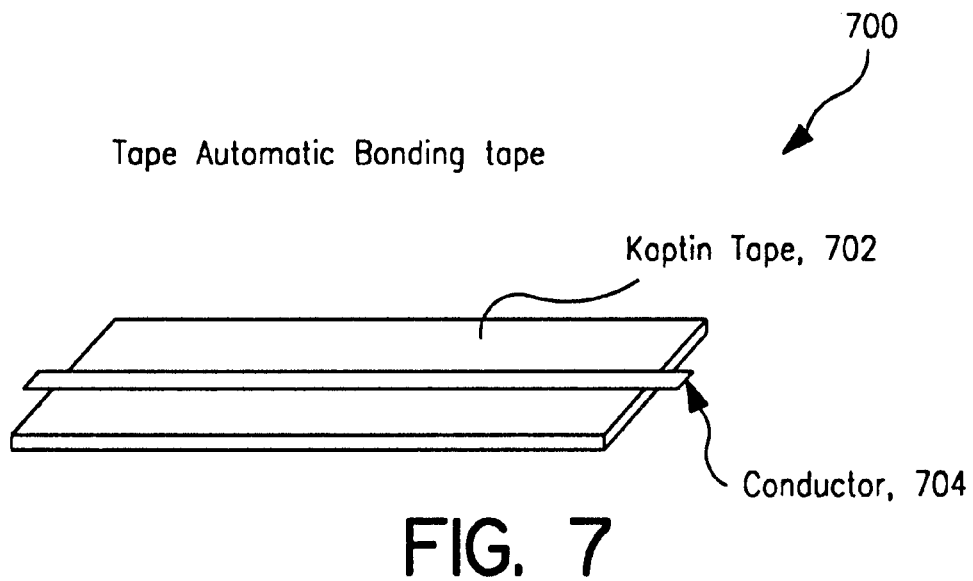
FIG. 7 illustrates a tape containing a conductor, which may be used in a process called tape automated bonding.

FIG. 7 illustrates an example of an electronic coupling means that includes an associated inductance that can be manipulated in order to provide impedance matching, i.e. this coupling means is tape automatic bonding (TAB) 700. TAB 700 is a technology in which conductors, which are encased in a tape, are applied to a device. It is routinely accomplished by using a tape 702, made of an insulating material such as Kapton in which a conductor 704 has been embedded. The tape can be dispensed from a reel and applied through an automated, semi automated, or hand interconnection process. The inductance of the TAB 700 is a function of at least the length of its conductor 704 and can be adjusted to provide the desired impedance matching for the RF power circuit 600.

Figure 8:
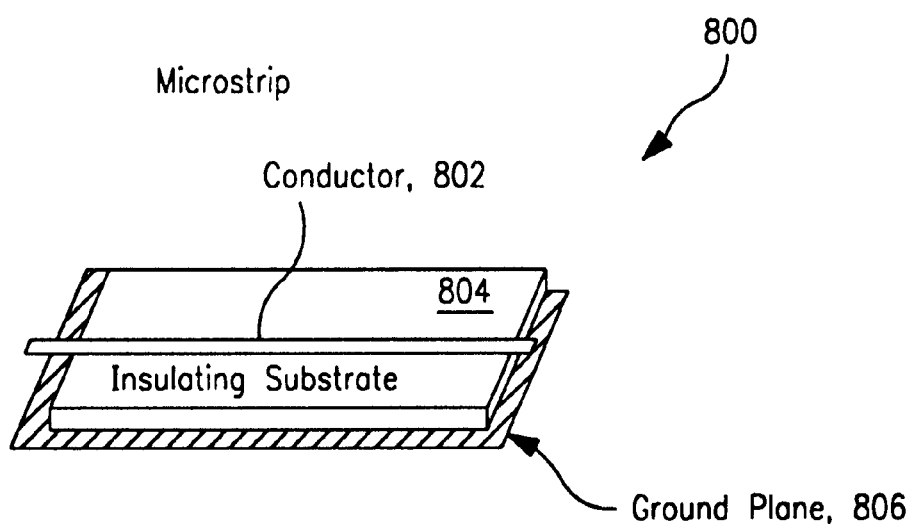
FIG. 8 illustrates a common microstrip conductor.

FIG. 8 illustrates another example of an electronic coupling means that includes an associated inductance that can be manipulated in order to provide impedance matching, i.e. this coupling means is a microstrip 800. A microstrip is a class of planar transmission lines consisting of one or more thin conducting strips 802, usually affixed to a supporting insulating substrate 804 attached to a ground plane 806. The inductance of the microstrip 800 is a function of at least the length of its conductor 802 and can be adjusted to provide the desired impedance matching for the RF power circuit 600.

Figure 9:
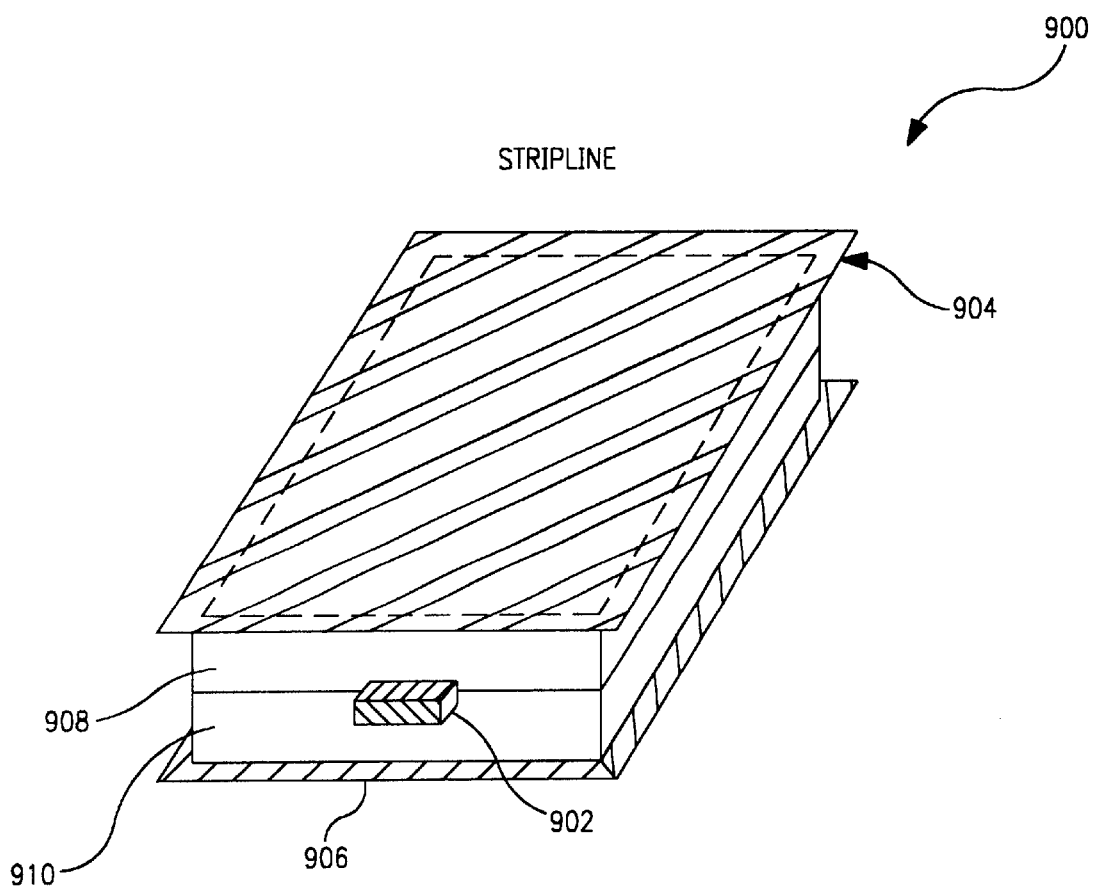
FIG. 9 illustrates a common stripline conductor.

FIG. 9 illustrates another example of an electronic coupling means that includes an associated inductance that can be manipulated in order to provide impedance matching, i.e. this coupling means is a stripline 900. A stripline is a type of planar transmission line comprising one or more thin conducting strips 902, which are located parallel to and approximately midway between two extended ground planes 904 and 906. The space between the strip and the ground planes are filled by homogenous dielectric layers 908 and 910. The inductance of the stripline 900 is a function of at least the length of its conductor 902 and can be adjusted to provide the desired impedance matching for the RF power circuit 600.

Figure 10:
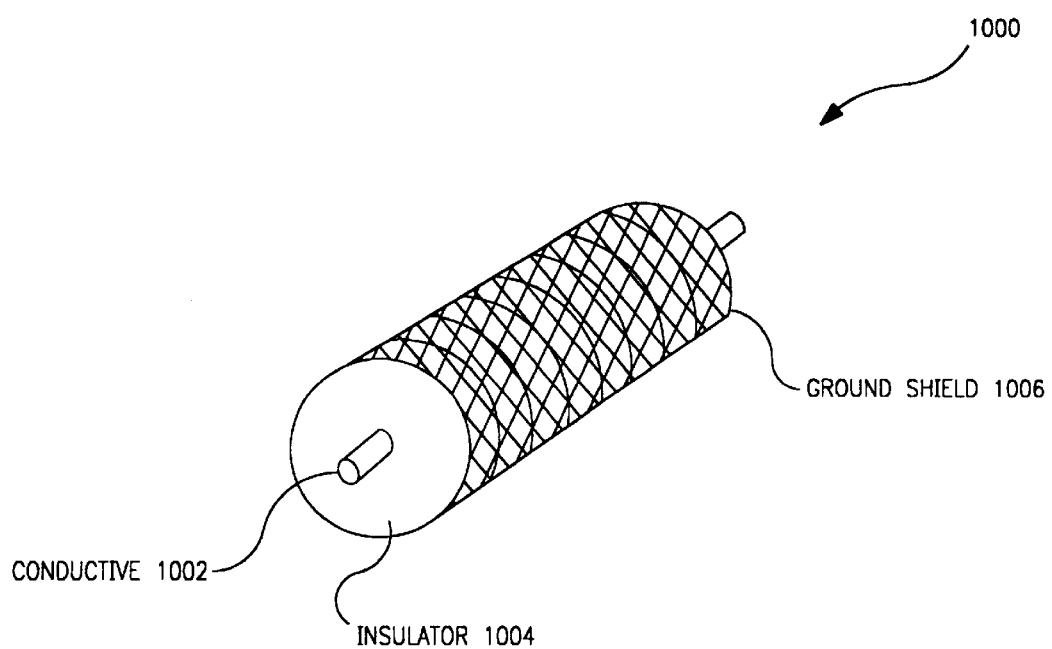
FIG. 10 illustrates a common coaxial conductor.

FIG. 10 illustrates another example of an electronic coupling means that includes an associated inductance that can be manipulated in order to provide impedance matching, i.e. this coupling means is a coaxial cable 1000. The coaxial cable consists of a central conductor 1002 surrounded by a cylindrical insulator (dielectric) 1006. A grounded cylindrical conductor 1004 is coaxially disposed over the outside surface of the cylindrical insulator 1004. The inductance of the coaxial cable 1000 is a function of at least the length of its central conductor 1002 and can be adjusted to provide the desired impedance matching for the RF power circuit 600.

Within each interconnection technology there are a variety of ways to adjust the inductance of the interconnection technology in order to achieve varying equivalent inductances, and hence impedance matching. Conductor sizes and cross sections may be varied, displacements may be inserted by changing insulators that support conductors, thickness of insulators may be varied, or a myriad of other adjustments applied which will affect the equivalent inductance of the interconnection. Additionally, the circuit parameter adjustment for impedance matching applicable to the two-device embodiment previously described may also be applicable to embodiments containing more than two active cells.

Figure 2:
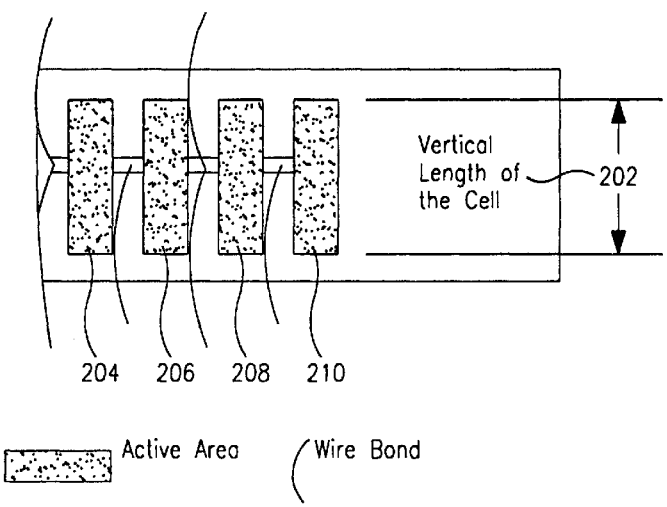
FIG. 2 illustrates four silicon cells arranged in a vertical, parallel configuration.
Figure 3:
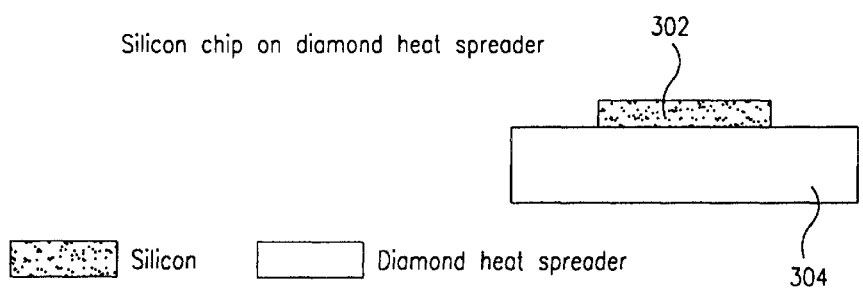
FIG. 3 illustrates a silicon chip on a diamond heat spreader.

In the present embodiment, the result of the correction of the electrical imbalances by adjusting the inductances L1 and L2 of the wire bonds, allows optimum utilization of both active cells. By fully utilizing both cells, the device can yield improved device output power, gain and efficiency. Device cells can be arranged in parallel, such as the horizontal and vertical parallel arrangements previously described with reference to FIGS. 1 and 2.

Improved Multiple Cell Parallel Arrangement

Figure 11:
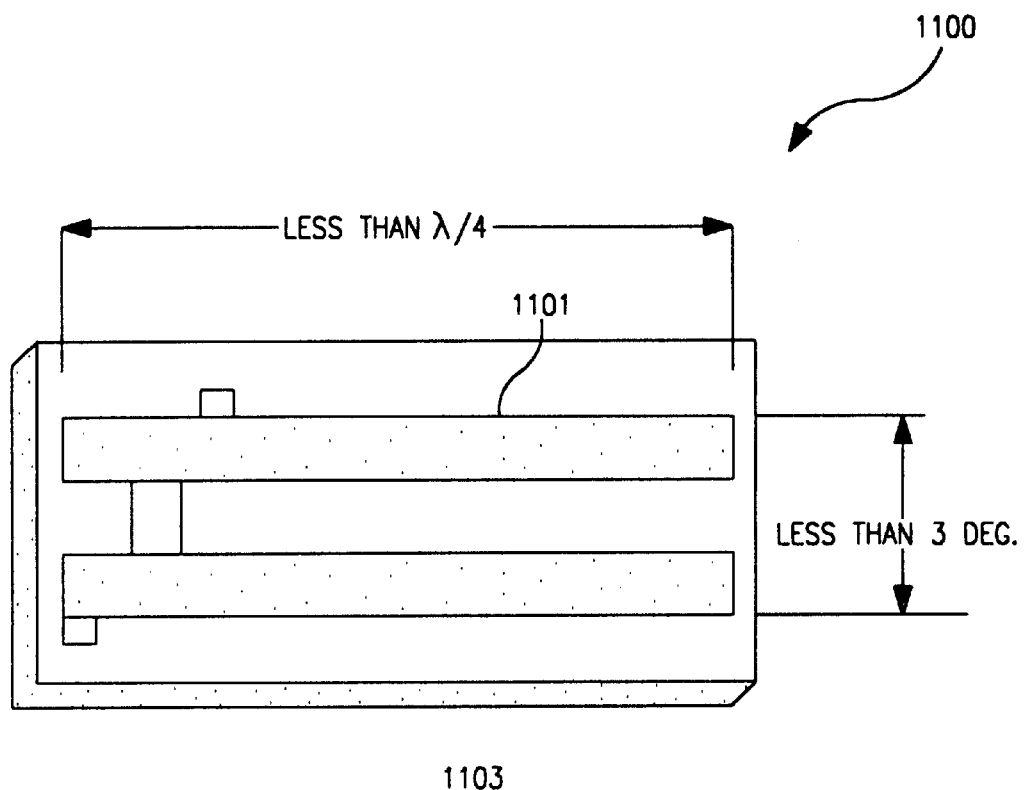
FIG. 11 illustrates a dual cell RF semiconductor device which functions substantially better after thinning of the substrate in accordance with another aspect of the invention.

FIG. 11 illustrates an RF power device 1100 in a parallel arrangement in accordance with another aspect of the invention. This particular parallel arrangement is particularly useful for amplification of signals in the S-Band frequency range. Although the S frequency band is used to illustrate the invention, it shall be understood that the embodiments and techniques of the invention may be used in other frequency bands The RF power device 1100 contains two cells 1101 and 1103 arranged in a vertical and parallel fashion as shown. In the preferred embodiment, the vertical height of cells 1101 and cell 1103 is less than three (3) degrees of the electrical wavelength of the operating frequency. Also, the width of the parallel cells 1101 and 1103 is less than a quarter wavelength for the reasons previously discussed. In addition to the preferred height and width, it is preferred that the chip be subject to thinning to reduce substrate loss.

Reduced-Height Semiconductor Chip Improvement

Figure 12:
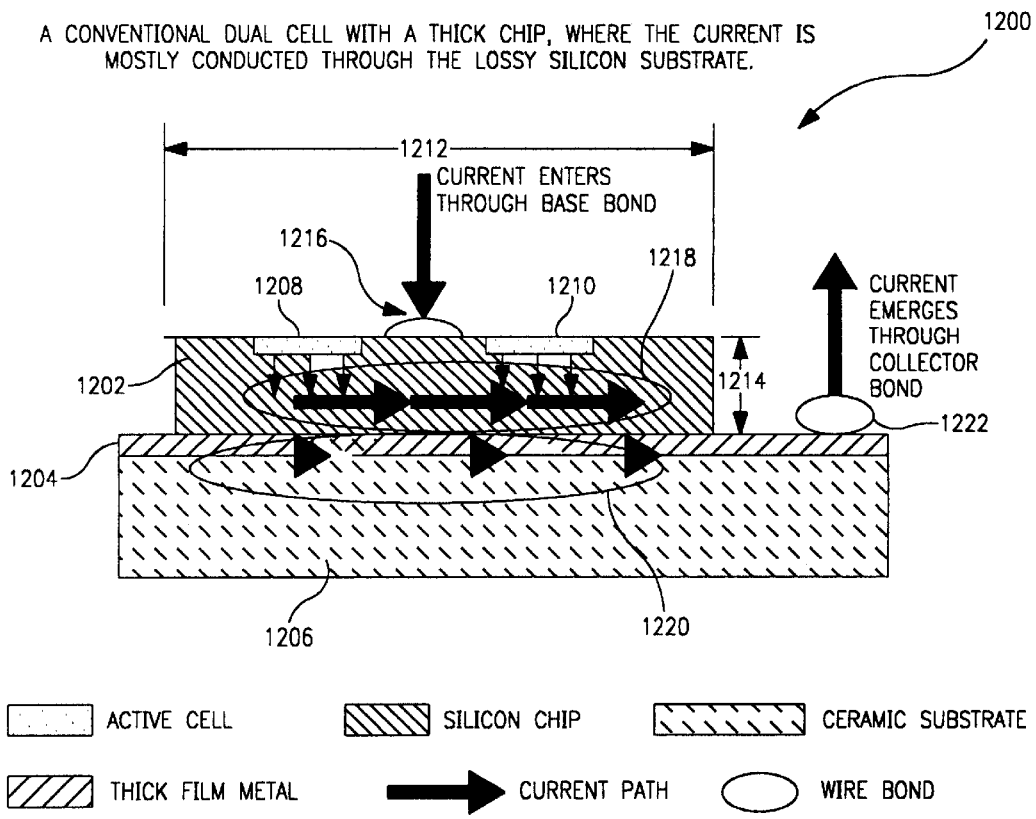
FIG. 12 illustrates a cross-sectional side view of a conventional dual-cell semiconductor device illustrating the conduction of a predominant amount of device current through a lossy silicon substrate layer, and a lesser conduction through a higher conductivity thick film metal layer.

FIG. 12 illustrates a conventional dual cell device 1200 used for background for the next improvement of the invention. The conventional dual cell device 1200 includes a silicon chip 1202 mounted on a top thick film metal layer 1204 disposed on a top surface of a ceramic substrate 1206. The silicon chip 1202 includes dual cells 1208 and 1210. The silicon chip 1202 includes a length 1212 that is preferably less than a quarter wavelength at the operating frequency of the device 1200. The silicon chip 1202 also includes a height 1214 that is preferably about 100 to about 150 micrometers. Current enters the device through the base bond 1216 and passes through the two active cells 1208 and 1210. The current then divides into a first portion 1218 primarily flowing through the silicon chip 1202, and a second portion 1220 primarily flowing through the thick film metal layer 1204 of the ceramic substrate 1206. The currents 1218 and 1220 recombines and emerges from the device through the collector bond 1222. Because the portion 1218 flows through the semiconductor chip 1202, which typically has a lossy characteristic, IR losses are incurred which results in lower output power and efficiency.

This problem with excessive IR losses due to current flow in the silicon substrate 1202 is particularly prevalent in multiple cell circuits, such as the dual cell device shown in FIGS. 11 and 12. The reason being is that typically the current flow from one of the cells to the output of the circuit has a longer path than the current flow pertaining to another cell. Referring to FIG. 12, the current flow from cell 1208 has a longer path to the output bond 1222, than the current flow from cell 1210 to the output bond 1222. Because of the longer current flow path for one of the devices, substantial IR losses occurs in this path. Typically, single cell device do not encounter this problem since the current path is typically designed to be a short as possible. With multiple cell devices, it is difficult to design the chip so that all of the current paths for all the cells have the same lengths to the output of the circuit.

Figure 13:
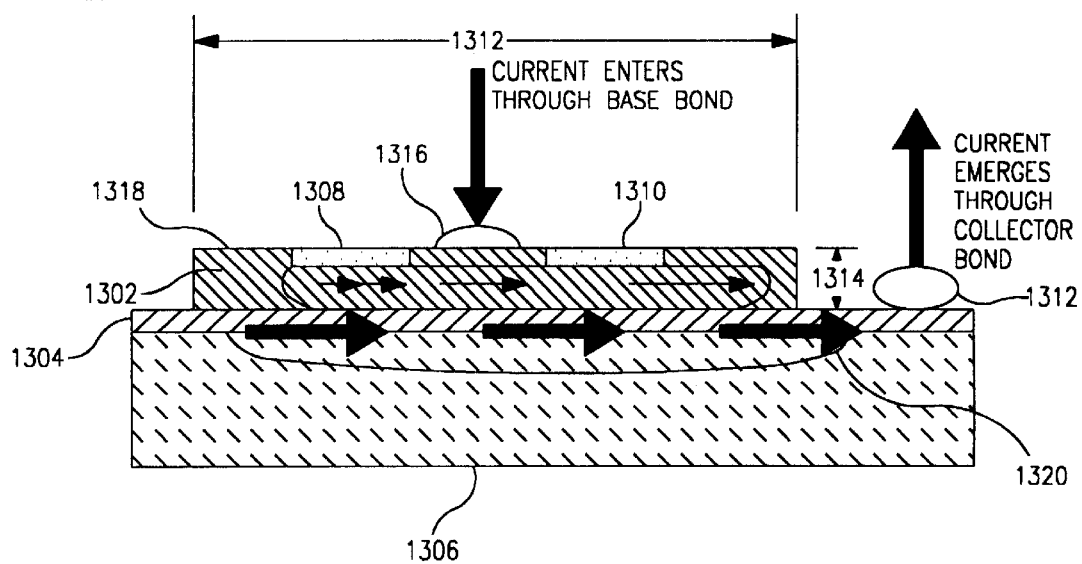
FIG. 13 illustrates a cross-sectional side view of a dual-cell semiconductor device illustrating the predominant flow of current through a highly conductive thick film metal layer and a lesser conduction through a lossy substrate layer when the substrate has been thinned in accordance with another aspect of the invention.

FIG. 13 illustrates an RF power circuit 1300 in accordance with another aspect of the invention. The RF power circuit 1300 includes a silicon chip 1302 mounted on a top thick film metal layer 1304 of a ceramic substrate 1306. The silicon chip 1302 includes dual cells 1308 and 1310. The silicon chip 1302 includes a length 1312 that is preferably less than a quarter wavelength at the operating frequency of the circuit 1300. The silicon chip 1302 also includes a height 1314 that is preferably about 50 to about 75 micrometers. Although this RF power circuit 1300 is similar to the conventional RF power circuit 1200, it differs in that the height 1314 of the silicon chip 1312 is much thinner than the height 1214 of the conventional silicon chip 1202. Because of this, the current flow through the circuit 1300 is substantially different.

In more detail, current enters the device through the base bond 1316 and passes through the two active cells 1308 and 1310. The current then divides into a first portion 1318 primarily flowing through the silicon chip 1302, and a second portion 1320 primarily flowing through the thick film metal layer 1304 of the ceramic carrier 1306. The currents 1318 and 1320 recombines and emerges from the device through the collector bond 1322. Because the silicon chip 1302 of the RF power device 1300 of the invention is much thinner than that of the conventional device 1200, more of the current flows through the thick film metal layer 1304 than through the silicon chip 1302. Since the metal layer 1304 is substantially less lossy than the silicon chip, less IR losses results, which allows the circuit 1300 to deliver more power and more efficiently. In the preferred embodiment, the height of the silicon chip 1302 is about 50 to about 75 micrometers Generally, the RF power circuit 1300 of the invention may be employed in amplifying S-band signals, whereas the conventional circuit 1200 is typically not. Because the RF power circuit 1300 of the invention has less IR losses, it dissipates less power, which allows the device to operate at lower temperatures. This increases the reliability of the circuit 1300. It has been experimentally shown that a dual horizontal silicon bipolar cell layout in accordance with the invention provides 20% more RF power at S band by simply thinning the silicon substrate. In summary, the RF power device 1300 of the invention is characterized by having lower IR losses, reduced operating junction temperature, increased reliability and reduced system cost over the conventional device 1200.

The thinning technique of the current embodiment is not limited to silicon devices, but can be used in other technologies including, but not limited to, Silicon-Germanium, Indium-Phosphide, LDMOS, and other technologies. Those skilled in the art will recognize that although the device chosen for this preferred embodiment was an S-Band device, the S-Band was chosen for illustrative purposes only. The thinning technique of the present preferred embodiment is usable at frequencies both higher and lower than S-band.

Improved Metal-Dielectric-Metal Capacitor

There are a variety of commercially available chip capacitors. For example, there are chip capacitors that have high dielectric constants for maximum capacitance per unit area, but these can be unstable with temperature. When they are heated, their capacitance tends to decrease. For this reason, high dielectric constant capacitors are generally employed where low temperature soldering techniques are acceptable. There are metal-dielectric-metal capacitors fabricated on silicon substrate. However, silicon substrates, even in a degenerate form, have resistance in the milli Ohm-cm, compared to metals, which are in micro Ohm-cm range. The 1000 times reduction in substrate loss can have wide spread benefits if it could be employed in high frequency applications.

Figure 14:
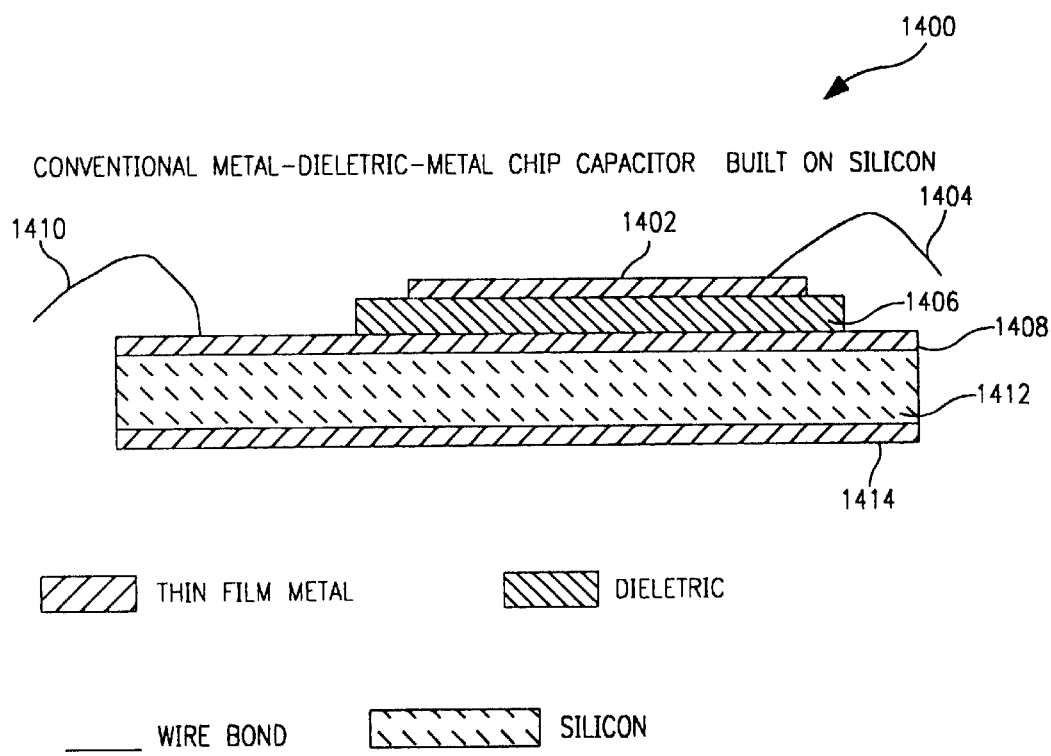
FIG. 14 illustrates a cross-sectional side view of a conventional MDM (Metal, Dielectric, Metal) chip capacitor built on silicon.

FIG. 14 illustrates an example of a conventional metal-dielectric-metal (MDM) chip capacitor 1400. The conventional MDM capacitor 1400 consists of a first plate 1402 preferably in the form of a thin film metal. A wire bond 1404 may be attached to the first plate 1402 for providing a connection to the capacitor 1400. The first plate 1402 is disposed on a dielectric 1406. The dielectric 1406 is mounted on a second plate 1408 formed of a thin film metal. A wire bond 1410 may be attached to the second plate 1408 for providing a connection to the capacitor 1400. The second plate 1408 is disposed on a silicon layer 1412, which includes an underlying thin film metal layer 1414 serving as a mounting for the capacitor 1400.

A difficulty arises because the second plate 1408 of the capacitor 1400 can only be connected to the ground plane via a wire bond, such as wire bond 1410, or through the silicon layer 1412 by way of a metalized via hole (not shown). The connection through the silicon layer is lossy, and may not be suitable for high frequency and power applications. A capacitor with a ground plane access to the mounting side is needed in the art. Such a capacitor would be useful in any of the embodiments described herein, or generally, where good ground plane access is needed.

Figure 15:
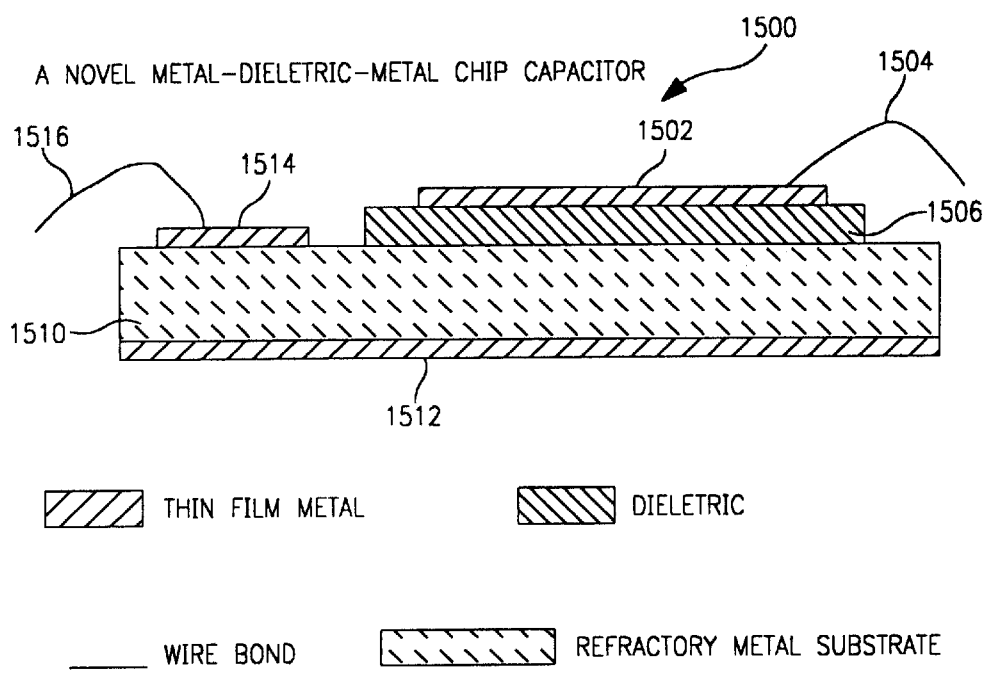
FIG. 15 illustrates a cross-sectional view of a novel MDM (Metal, Dielectric, Metal) chip capacitor in accordance with another aspect of the invention.

FIG. 15 illustrates an improved metal-dielectric-metal (MDM) capacitor 1500 in accordance with another aspect of the invention. The improved MDM capacitor 1500 includes a first capacitor plate 1502 preferably formed of a thin film metal layer. A wire bond 1504 or other connection means may be attached to the first capacitor plate 1502 for providing a connection to the capacitor 1500. Other methods of connecting to the capacitor 1500 may be effectuated as known to those skilled in the art. The first capacitor plate 1502 is disposed on a dielectric layer 1506, preferably of silicon-nitride ($Si_3N_4$) deposited by chemical vapor deposition (CVD). The dielectric layer 1506 is mounted on a "refractory" metal substrate layer 1510. The refractory metal substrate 1510 forms the second plate of the capacitor 1500. The refractory metal substrate 1510 may include an underlying thin film metal layer 1512 to serve as a mounting surface for the capacitor 1500. An additional thin film metalized pad 1514 is disposed on the refractory metal substrate 1510. A wire bond 1516 or other connection means may be attached to the thin film metal layer 1514 for providing a connection to the capacitor 1500.

A refractory metal is chosen for the substrate layer 1510 because its coefficient of thermal expansion is relatively low or at least similarly matched with that of the dielectric layer 1506. This reduces the stress at the interface of the dielectric layer 1506 and the refractory metal substrate 1510 when the capacitor 1500 is exposed to significant temperature variations, thereby reducing potential fractures of the dielectric 1506. In the preferred embodiment, the refractory metal substrate layer 1512 comprises molybdenum and/or tungsten. In the typical mounting of the capacitor 1500, the thin film metal layer 1512 is mounted on a ground plane. Alternatively, the thin film layer metalized pad 1512 can be mounted to a metalized pad for coupling to the collector of the RF transistor as described with reference to RF power circuit 500 previously described. This coupling eliminates the need for a separate coupling between the capacitor and the collector of the device, thereby eliminating the parasitic inductance associated with a wire bond coupling.

For the refractory metal substrate 1510, it is preferred that the substrate be cut along a N<100>lattice direction. As a result of this particular cut, the refractory metal substrate 1510 exhibits high tensile strength. Preferably, a thin film refractory gold metallization layer is deposited on the underlying surface of the substrate to form the thin film metal layer 1512. Capacitor and contact patterning can be done with a projection type mask aligner. The substrate can be lapped to desired thickness, back side metalized and sawed.

Another variation of the MDM capacitor 1500 of the invention is to use a thin semiconductor material for the substrate layer 1500, instead of a refractory metal material. For example, the semiconductor material for layer 1500 could be silicon. Preferably, the semiconductor layer should be thinner than the refractory layer in order to reduce the resistance of the substrate layer 1510. Furthermore, the thinning of the semiconductor substrate 1510 allows for more current to flow through the underlying metal layer 1512. Preferably, the semiconductor substrate has a thickness of about 50 to about 75 micrometers. However, experimental results have showed that thinning the semiconductor below 60 microns is less practical because of handling problems associated with the thinned substrate. The effect of lowering the equivalent resistance, however, continues as the semiconductor layer is thinned to less than 60 microns and improved handling techniques may make even thinner layers practical.

Unlike high dielectric constant available ceramic chip capacitors, the improved MDM capacitor 1500 of the invention is stable with temperature up to 450 C. It is also superior in quality factor (Q) as compared to conventional MOS or other conventional metal-insulator-metal capacitors built on silicon substrate.

Improved Dual-Device Power Circuit

Figure 16:
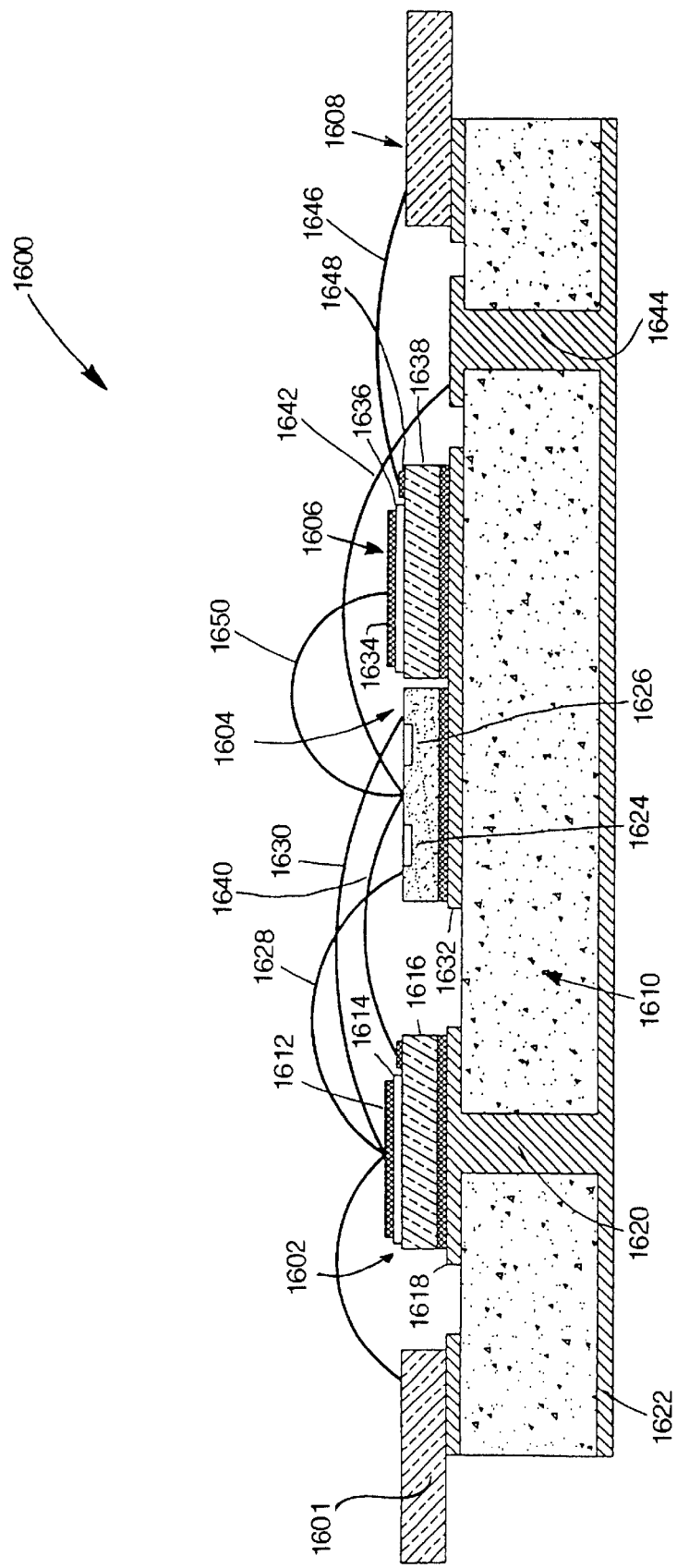
FIG. 16 illustrates a cross-sectional side view of a high power, high frequency power circuit in accordance with another aspect of the invention.

FIG. 16 illustrates a cross-sectional side view of an RF power circuit 1600 in accordance with the invention that incorporates at least some of the elements of the previous embodiments. The RF power circuit has encompassed several features of the previous embodiments in order to achieve a desired power and frequency performance. The present embodiment illustrates that the various elements of the previous embodiments that individually improve the power and frequency performance of a device can be complimentarily combined to form a substantially improved device with regard to power and frequency parameters. As a result, the RF power circuit 1600 of the invention has an improved power dissipation v. maximum frequency characteristics.

The RF power circuit 1600 comprises an input lead 1601, an input shunt capacitor 1602, a duel-device semiconductor chip 1604, an output DC blocking capacitor 1606, and an output lead 1608, all of which are mounted on a ceramic carrier 1610. In the preferred embodiment, the input shunt capacitor 1602 is of a metal-dielectric-metal type. The input shunt capacitor 1602 includes a top capacitor plate 1612, an intermediate dielectric layer 1614, and a bottom capacitor plate 1616, which could either be a refractory metal substrate or a semiconductor substrate as previous discussed in more detail. The input shunt capacitor 1602 is mounted on a thin or thick film metal layer 1618 in order to electrically couple that layer 1618 with the lower capacitor plate 1616. The metal layer 1618 is also electrically coupled to a metalized via hole 1620 extending downward through the ceramic carrier 1610 to an underlying metal layer 1622 that would be typically connected to ground.

The dual-device semiconductor chip 1604 preferably includes two bipolar transistors 1624 and 1626, each having emitter, base and collector terminals. The emitters of the transistors 1624 and 1626 are electrically coupled to the input shunt capacitor 1602 preferably by way of wire bonds 1628 and 1630, respectively. The bases of the transistors 1624 and 1626 are electrically coupled to a ground terminal preferably by wire bonds 1640 (bottom plate of capacitor 1602) and 1642 (via hole 1644 through ceramic carrier 1610). The collectors of the transistors 1624 and 1626 are electrically coupled to a thick or thin film layer 1632 disposed on the top surface of the ceramic carrier 1610.

In the preferred embodiment, the output DC blocking capacitor 1606 is of a metal-dielectric-metal type. The DC blocking capacitor 1606 includes a top capacitor plate 1634, an intermediate dielectric layer 1636, and a bottom capacitor plate 1638, which could either be a refractory metal substrate or a semiconductor substrate as previous discussed in more detail. The DC blocking output capacitor 1606 is mounted on the metal layer 1632 in order to electrically couple the lower plate 1638 of the capacitor 1606 to the collectors of the transistors 1624 and 1626. In this way, wire bond connections from the collectors of the transistors to the DC blocking capacitor are eliminated. And as previously discussed, this aspect of the invention improves both the power and frequency performance of the RF power circuit 1600. The bottom capacitor plate 1638 of the DC blocking capacitor 1606 is coupled to the output lead 1608 by way of wire bond 1646 mounted on a metalized pad 1648 disposed on the bottom capacitor plate 1638 of the capacitor 1606. The top capacitor plate 1634 of capacitor 1606 is electrically coupled to the common bases of the transistors 1624 and 1626 by way of wire bond connection 1650.

The wire bond 1630 connecting the emitter of transistor 1626 to the input shunt capacitor 1602 has a greater thickness than the corresponding wire bond 1628 connecting the emitter of transistor 1624. The reasons for this is that transistor 1626 is further away from the input shunt capacitor 1602 than transistor 1624. Because of the unequal distances, in order to provide impedance matching of the two devices 1624 and 1626, the longer wire bond 1630 is made thicker in order to adjust its inductance so that it is better matched with the inductance of the shorter wire bond 1628. This illustrates that configuring the wire bonds 1628 and 1630 allows for impedance matching of the devices 1624 and 1626. And as previously discussed, improved power and frequency performance is achieved if the input impedance of both devices are substantially matched. Those skilled in the art will recognize that the inductance of the wire bonds may be adjusted in a variety of ways in order to match the impedance of the devices 1624 and 1626. In order to achieve different equivalent inductances, different size wires may be employed, different layouts of the wire may be employed, and even different types of wire may be used, or a variety of other adjustments may be made.

In addition, other electrical coupling technologies can be employed in the matching process, such as the tape automated bonding (See FIG. 7), microstrip (See FIG. 8), stripline (See FIG. 9) and coaxial cable (See FIG. 10). These different technologies are used to illustrate the great variety of ways the matching may be accomplished, and are not intended to represent a comprehensive list of technologies that may be used. In addition, with regard to each of the electrical coupling technologies, there are a variety of ways of adjusting the connection inductances in order to provide impedance matching of the devices. They may be bent, twisted, have different sizes, layouts, spacing or other techniques to create the inductances needed for matching.

The foregoing description of the exemplary embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

It is claimed:

1. A chip capacitor, comprising:
    a bottom capacitor plate having upper and lower surfaces, said bottom capacitor plate being formed of a refractory metal;
    a first thin metallization layer formed on said lower surface of said bottom capacitor plate for attachment to a metallized pad;
    a dielectric layer disposed on a first region of said upper surface of said bottom capacitor plate;
    a top capacitor plate disposed on an upper surface of said dielectric layer; and
    a second thin film metallization layer formed on a second region of said upper surface of said bottom capacitor plate for attachment to a wire or ribbon bond.

2. The chip capacitor of claim 1, wherein said refractory metal includes molybdenum.

3. The chip capacitor of claim 1, wherein said refractory metal includes tungsten.

4. The chip capacitor of claim 1, wherein said upper surface of said bottom capacitor plate includes a metallized pad for providing an external electrical attachment to the bottom plate of the capacitor.

5. The chip capacitor of claim 1, further including a mounting metallized layer disposed on said lower surface of said bottom capacitor plate.

6. A chip capacitor, comprising:
    a bottom capacitor plate having upper and lower surfaces, said bottom capacitor plate formed of silicon having a thickness of about 50 to 75 micrometers;
    a first thin metallization layer formed on said lower surface of said bottom capacitor plate for attachment to a metallized pad;
    a dielectric layer disposed on a first region of said upper surface of said bottom capacitor plate;
    a top capacitor plate disposed on an upper surface of said dielectric layer; and
    a second thin film metallization layer formed on a second region of said upper surface of said bottom capacitor plate for attachment to a wire or ribbon bond.

7. The chip capacitor of claim 6, wherein said upper surface of said bottom capacitor plate includes a metallized pad for providing an external electrical attachment to the bottom plate of the capacitor.

8. The chip capacitor of claim 6, further including a mounting metallization layer disposed on said lower surface of said bottom capacitor plate.

9. A chip capacitor comprising:
    an electrically conducting substrate;
    a first thin film metallization layer disposed on a bottom surface of said electrically conducting substrate, wherein said first thin film metallization layer is exposed for mounting on an electrically conductive surface;
    a dielectric disposed on a first portion of a top surface of said electrically conducting substrate;
    a second thin film metallization layer disposed on a second portion of said top surface of said electrically conducting substrate, wherein said second thin film metallization layer is exposed for connection to a first wire or ribbon bond; and
    a third thin film metallization layer disposed over said dielectric, wherein said third film metallization layer is exposed for connection to a second wire or ribbon bond.

10. The chip capacitor of claim 9, wherein said electrically conducting substrate comprises a refractory metal.

11. The chip capacitor of claim 10, wherein said refractory metal comprises molybdenum.

12. The chip capacitor of claim 10, wherein said refractory metal comprises tungsten.

13. The chip capacitor of claim 9, wherein said electrically conducting substrate comprises a semiconductor material.

14. The chip capacitor of claim 13, wherein said semiconductor material comprises silicon.

15. The chip capacitor of claim 9, wherein said first thin film metallization layer comprises gold.

16. The chip capacitor of claim 9, wherein said dielectric comprises silicon nitride.

\* \* \* \* \*